US012562551B2

(12) United States Patent
Dejima et al.

(10) Patent No.: US 12,562,551 B2
(45) Date of Patent: Feb. 24, 2026

(54) WAVELENGTH BEAM COMBINING DEVICE, DIRECT DIODE LASER DEVICE, AND LASER PROCESSING MACHINE

(71) Applicant: NICHIA CORPORATION, Anan (JP)

(72) Inventors: Norihiro Dejima, Yokohama (JP); Masaki Omori, Toshima-ku (JP)

(73) Assignee: NICHIA CORPORATION, Anan (JP)

( * ) Notice: Subject to any disclaimer, the term of this patent is extended or adjusted under 35 U.S.C. 154(b) by 711 days.

(21) Appl. No.: 18/063,815

(22) Filed: Dec. 9, 2022

(65) Prior Publication Data

US 2023/0187907 A1 Jun. 15, 2023

(30) Foreign Application Priority Data

Dec. 15, 2021 (JP) ................................. 2021-203147

(51) Int. Cl.
*H01S 5/40* (2006.01)
*B23K 26/06* (2014.01)
(Continued)

(52) U.S. Cl.
CPC ........ *H01S 5/4012* (2013.01); *B23K 26/0613* (2013.01); *G02B 5/1866* (2013.01);
(Continued)

(58) Field of Classification Search
CPC ............ G02B 27/1086; G02B 27/1006; G02B 27/144; G02B 27/283; G02B 27/286;
(Continued)

(56) References Cited

U.S. PATENT DOCUMENTS 6,192,062 B1 2/2001 Sanchez-Rubio et al.
7,233,442 B1 * 6/2007 Brown .................. G02B 27/144
359/556

(Continued)

FOREIGN PATENT DOCUMENTS

JP 2002-267951 A 9/2002
JP 2003-114402 A 4/2003
(Continued)

*Primary Examiner* — Vy T Nguyen
(74) *Attorney, Agent, or Firm* — Foley & Lardner LLP

(57) ABSTRACT

A wavelength beam combining device includes: a polarization beam splitter configured to separate the plurality of laser beams into a plurality of first polarized light beams linearly polarized in a first polarization direction and a plurality of second polarized light beams linearly polarized in a second polarization direction that is orthogonal to the first polarization direction; a first polarization conversion element configured to convert the second polarized light beams into a plurality of third polarized light beams linearly polarized in the first polarization direction; a diffraction grating configured to diffract the plurality of first polarized light beams and generate a coaxially combined first wavelength-combined beam, and to diffract the plurality of third polarized light beams and generate a coaxially combined second wavelength-combined beam; and a polarization beam combiner configured to generate and emit a third wavelength-combined beam into which the first wavelength-combined beam and the second wavelength-combined beam have been coaxially combined.

15 Claims, 9 Drawing Sheets

(51) Int. Cl.

| | |
|---|---|
| *G02B 5/18* | (2006.01) |
| *G02B 27/10* | (2006.01) |
| *G02B 27/28* | (2006.01) |
| *H01S 5/02251* | (2021.01) |

(52) U.S. Cl.
CPC ....... *G02B 27/1086* (2013.01); *G02B 27/283* (2013.01); *G02B 27/286* (2013.01); *H01S 5/02251* (2021.01); *H01S 5/4087* (2013.01)

(58) Field of Classification Search
CPC .. G02B 5/1866; G02B 27/145; G02B 27/108; G02B 27/123; G02B 27/285; G02B 5/203; G02B 5/32; B23K 26/0613; B23K 26/00; B23K 26/702; G02F 1/133621; G02F 1/133622

USPC ......... 353/20; 359/556; 362/19; 219/121.76; 356/494, 499
See application file for complete search history.

(56) References Cited

U.S. PATENT DOCUMENTS

| | | | |
|---|---|---|---|
| 2002/0126385 | A1 | 9/2002 | Asami et al. |
| 2003/0063385 | A1 | 4/2003 | Takushima et al. |
| 2004/0080823 | A1 | 4/2004 | Takushima et al. |
| 2021/0098973 | A1* | 4/2021 | Gong .................... G02B 26/06 |

FOREIGN PATENT DOCUMENTS

| | | |
|---|---|---|
| JP | 2003-149497 A | 5/2003 |
| JP | 2004-133204 A | 4/2004 |
| JP | 2004-139074 A | 5/2004 |

* cited by examiner

WAVELENGTH BEAM COMBINING DEVICE, DIRECT DIODE LASER DEVICE, AND LASER PROCESSING MACHINE

CROSS-REFERENCE TO RELATED APPLICATION

This application claims priority to Japanese Patent Application No. 2021-203147, filed on Dec. 15, 2021, the entire contents of which are hereby incorporated by reference.

BACKGROUND

The present application relates to a wavelength beam combining device, a direct diode laser device, and a laser processing machine.

High-power and high-radiance laser beams are used for performing processing such as cutting, punching, or marking for various kinds of materials, or welding a metal material. Some of the carbon dioxide gas laser apparatuses and YAG solid laser apparatuses that have been used for such laser processing are being replaced by fiber laser apparatuses, which have a high efficiency of energy conversion. Laser diodes (hereinafter simply referred to as LD) are used as pumping light sources of fiber lasers. According to increase in output of LDs in the recent years, techniques using LDs as light sources of a laser beam directly irradiating a material to process the material, instead of using LDs as pumping light sources, have been developed. Such techniques are referred to as "direct diode laser (DDL) technology."

U.S. Pat. No. 6,192,062 describes an example of a light source device configured to combine a plurality of laser beams of respectively different wavelengths, which have been emitted from a plurality of LDs, to increase optical output power. Coaxially combining a plurality of laser beams of respective wavelengths, referred to as "wavelength beam combining (WBC)" or "spectral beam combining (SBC)," may be used in enhancing the optical output power and radiance of a DDL system or the like, for example.

SUMMARY

There is a demand for further increase in the output power and power density of laser beams that have been combined through wavelength beam combining.

In one embodiment of the present disclosure, a wavelength beam combining device for combining a plurality of laser beams of respectively different peak wavelengths includes: a polarization beam splitter configured to separate the plurality of laser beams into a plurality of first polarized light beams linearly polarized in a first polarization direction and a plurality of second polarized light beams linearly polarized in a second polarization direction that is orthogonal to the first polarization direction; a first polarization conversion element configured to convert the plurality of second polarized light beams into a plurality of third polarized light beams linearly polarized in the first polarization direction; at least one diffraction grating configured to diffract the plurality of first polarized light beams and generate a first wavelength-combined beam into which the plurality of first polarized light beams are coaxially combined, and to diffract the plurality of third polarized light beams and generate a second wavelength-combined beam into which the plurality of third polarized light beams are coaxially combined; a second polarization conversion element to change a polarization state of the first wavelength-combined beam or the second wavelength-combined beam so that the polarization directions of the first wavelength-combined beam and the second wavelength-combined beam become orthogonal to each other; and a polarization beam combiner configured to generate and emit a third wavelength-combined beam into which the first wavelength-combined beam and the second wavelength-combined beam are coaxially combined.

In another embodiment of the present disclosure, a direct diode laser device includes: the above wavelength beam combining device; a plurality of semiconductor laser devices configured to emit laser light of respectively different peak wavelengths; and an optical fiber array device configured to generate, from the laser light emitted from the plurality of semiconductor laser devices, the plurality of laser beams to be incident on the polarization beam splitter of the wavelength beam combining device.

In another embodiment of the present disclosure, a laser processing machine includes: at least one direct diode laser device as above; an optical transmission fiber coupled to the third wavelength-combined beam or third wavelength-combined beams emitted from the at least one direct diode laser device; and a processing head connected to the optical transmission fiber.

According to embodiments of the present disclosure, there is provided a wavelength beam combining device, a direct diode laser device, and a laser processing machine that can further enhance the output power and power density of laser beams that have been combined through wavelength beam combining.

DETAILED DESCRIPTION

First Embodiment of Wavelength Beam Combining Device

Figure 1:
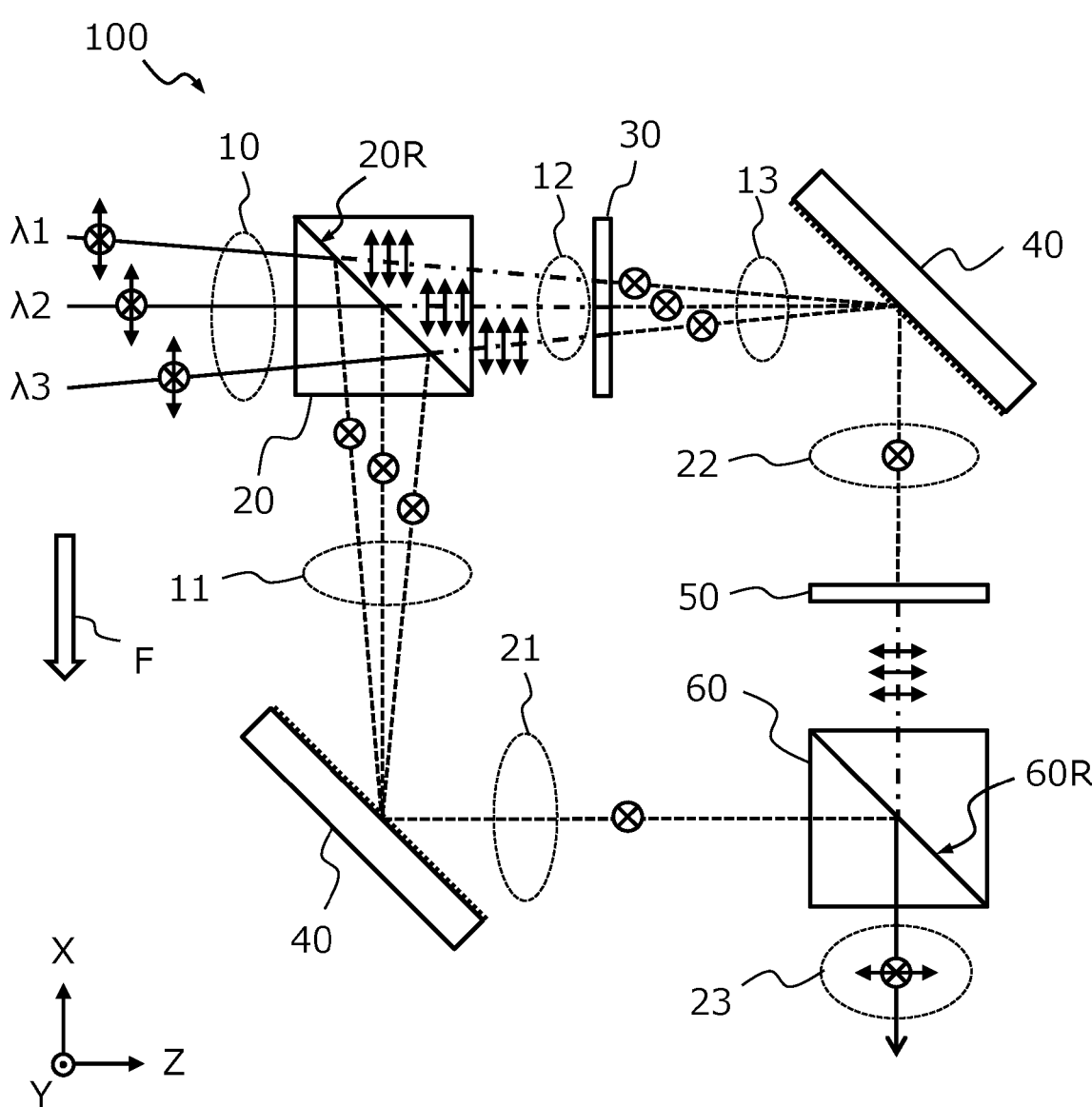
FIG. 1 is a diagram showing an example structure of a first embodiment of a wavelength beam combining device according to the present disclosure.

With reference to FIG. 1, a first embodiment of a wavelength beam combining device according to the present disclosure will be described. For reference, an X axis, a Y axis, and a Z axis, which are orthogonal to one another, are schematically shown in the attached drawings including FIG. 1.

A wavelength beam combining device 100 according to the present embodiment shown in FIG. 1 is configured to combine a plurality of laser beams 10 of respectively different peak wavelengths. In FIG. 1, for simplicity, an example structure of a device that coaxially combines three laser beams 10 having respective peak wavelengths of λ1, λ2 and λ3 is shown. The quantity of laser beams 10 to be combined is not limited to three, and two laser beams 10, or four or more laser beams 10, of respectively different peak wavelengths may be combined. Hereinafter, the peak wavelengths of the plurality of laser beams 10 to be combined may be denoted as λn, where "n" is an integer of 1 or greater that serves to distinguish (identify) one laser beam 10 from another. In the illustrated example, the relationship λ1<λ2<λ3 is satisfied. Although the peak wavelength λn may be represented in any appropriate unit, it may be in nanometers (nm), for example.

In FIG. 1, each of the plurality of laser beams 10 is depicted by a simple straight line. The actual laser beam 10 is a light beam having a distribution of intensity across a plane that is orthogonal to its direction of travel. This intensity distribution can be approximated by a distribution function, such as a Gaussian distribution, for example, within the plane that is orthogonal to the direction of travel of the light beam. The diameter of the light beam is defined, for example, by the size of a cross-sectional area that has an intensity equal to or greater than $1/e^2$ times the intensity at the beam center. In the present disclosure, the laser beam 10 is collimated through optics such as a collimator lens. In the figure, in order to schematically show the direction of travel of each collimated light beam (e.g., a laser beam 10), the center axis of the light beam is depicted by a straight line. Each such straight line may be considered as representing a ray of light passing through the center of the respective light beam.

The wavelength beam combining device 100 includes a polarization beam splitter 20, on which the plurality of laser beams 10 are incident. The polarization beam splitter 20 includes a reflection/transmission plane 20R whose transmittance and reflectance vary depending on the polarization state of the incident laser beam 10. Light is an electromagnetic wave, and the electromagnetic field of light is a transverse wave oscillating along a direction perpendicular to the direction of travel. The polarization state of a laser beam may vary depending on the gain medium, cavity, lasing method, and the like of the laser light source. Even when a laser beam is in a particular polarization state upon emission from a laser light source, the laser beam may be changed in polarization state or may become depolarized while passing through a propagation medium, e.g., an optical fiber. The reflection/transmission plane 20R of the polarization beam splitter 20 is able to selectively reflect a polarized component that has been linearly polarized in a predetermined direction, and transmit a polarized component that has been linearly polarized in a direction orthogonal to the predetermined direction. A multilayer dielectric film having polarization dependence is provided at the reflection/transmission plane 20R, for example. The polarization beam splitter 20 in the example of FIG. 1 separates a laser beam 10 traveling along the Z axis direction into: a plurality of first polarized light beams 11 that are linearly polarized in a first polarization direction (Y axis direction); and a plurality of second polarized light beams 12 that are linearly polarized in a second polarization direction (X axis direction) that is orthogonal to the first polarization direction. Note that the plurality of laser beams 10 do not need to be parallel to one another when being incident on the polarization beam splitter 20. In the example of FIG. 1, the directions of travel of the three laser beams 10 are adjusted so as to make predetermined angles. The details of these "predetermined angles" will be described later.

In general, when a ray is incident on the surface of an object, a plane that contains both the normal of the surface of the object at the point of incidence and the vector along the direction of travel of the ray (wave vector) is defined as the "plane of incidence." Moreover, light that is linearly polarized in a direction perpendicular to the plane of incidence is called S-polarized light, whereas light that is linearly polarized in a direction parallel to the plane of incidence is called P-polarized light. In the example of FIG. 1, the reflection/transmission plane 20R of the polarization beam splitter 20 is perpendicular to the XZ plane, whereas the normal of the reflection/transmission plane 20R is in a plane parallel to the XZ plane. Moreover, the directions of travel of the laser beams 10 are parallel to the XZ plane. Therefore, the "plane of incidence" when a given laser beam 10 is incident on the reflection/transmission plane 20R is parallel to the XZ plane. In the present disclosure, light that is linearly polarized in the first polarization direction (which is a direction perpendicular to the XZ plane) is referred to as "S-polarized light." On the other hand, light that is linearly polarized in a direction parallel to the XZ plane (i.e., the second polarization direction, which is orthogonal to the first polarization direction) is referred to as "P-polarized light." In the attached drawings, a symbol composed of a small circle encircling a cross mark represents "S-polarized light," whereas arrows in opposite directions represents "P-polarized light." Although the polarization direction of "P-polarized light" is parallel to the XZ plane, it is perpendicular to the direction of travel of the laser beam; therefore, when the direction of travel of the laser beam rotates through reflection or diffraction while remaining parallel to the XZ plane, the polarization direction of the "P-polarized light" also rotates within a plane that is parallel to the XZ plane. Therefore, in the meaning of the present disclosure, the "second polarization direction" is defined as a direction that is perpendicular to the direction of travel of a laser beam and also perpendicular to the first polarization direction.

Figure 2:
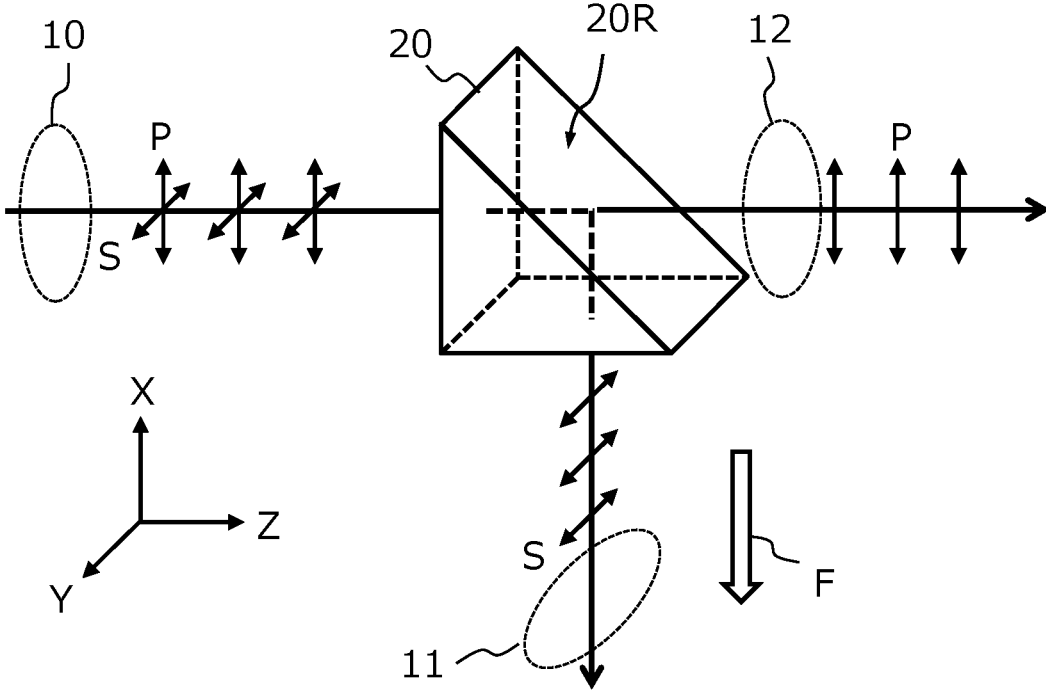
FIG. 2 is a perspective view schematically showing an example structure and functions of a polarization beam splitter.

FIG. 2 is a perspective view schematically showing an example structure and functions of the polarization beam splitter 20. In the example of FIG. 2, a laser beam 10 containing S-polarized light and P-polarized light travels in the positive direction of the Z axis, so as to be incident on the polarization beam splitter 20. The polarization state of the laser beam 10 containing S-polarized light and P-polarized light may be a state of "unpolarized light," in which S-polarized light and P-polarized light are randomly mixed, for example. In the present disclosure, "unpolarized light" means light that is not linearly polarized in any given direction. Therefore, "unpolarized light" in this broad sense may also encompass circularly polarized light and ellipti-cally polarized light. A mixed state of linearly polarized light, such that its polarization direction varies randomly or regularly with time or place, may also be encompassed within "unpolarized light."

In the example of FIG. 2, the reflection/transmission plane 20R of the polarization beam splitter 20 reflects the S-po-larized light contained in the laser beam 10, and transmits the P-polarized light. As a result, the laser beam 10 is separated into: a first polarized light (S-polarized light) beam 11 that is linearly polarized in the first polarization direction (Y axis direction); and a second polarized light (P-polarized light) beam 12 that is linearly polarized in the second polarization direction (X axis direction).

What is important in the present disclosure is that the reflection/transmission plane 20R of the polarization beam splitter 20 causes separation between reflected light and transmitted light whose polarization directions are orthogo-nal to each other (polarization separation). If the laser beam 10 consists only of S-polarized light, then the laser beam 10 produces the first polarized light (S-polarized light) beam 11, but not the second polarized light (P-polarized light) beam 12. Conversely, if the laser beam 10 consists only of P-polarized light, then the laser beam 10 does not produce the first polarized light (S-polarized light) beam 11, but only produces the second polarized light (P-polarized light) beam 12.

If the plurality of laser beams 10 being incident on the polarization beam splitter 20 are "unpolarized light," the laser beam 10 will be separated into: a plurality of first polarized light (S-polarized light) beams 11 that are linearly polarized in the first polarization direction (Y axis direction), and a plurality of second polarized light (P-polarized light) beams 12 that are linearly polarized in the second polariza-tion direction (X axis direction). However, even when a given laser beam 10 is linearly polarized light in a state where S-polarized light and P-polarized light are super-posed, such a laser beam 10 can still produce a first polarized light (S-polarized light) beam 11 and a second polarized light (P-polarized light) beam 12 so long as its polarization direction is parallel to neither of the X axis and the Y axis in FIG. 2. Moreover, when the plurality of laser beams 10 incident on the polarization beam splitter 20 are linearly polarized in respectively different directions, such laser beams 10 as a whole can be separated into: a plurality of first polarized light (S-polarized light) beams 11 that are linearly polarized in the first polarization direction (Y axis direction); and a plurality of second polarized light (P-polarized light) beams 12 that are linearly polarized in the second polariza-tion direction (X axis direction). Therefore, unless all of the "plurality" of laser beams 10 that are incident on the polarization beam splitter 20 are linearly polarized in either one of the X axis direction and the Y axis direction in FIG. 2, polarization separation by the polarization beam splitter 20 is achieved, and accordingly the plurality of laser beams 10 are regarded as being "unpolarized light" as a whole.

Although FIG. 2 illustrates a prism-shaped polarization beam splitter 20, the polarization beam splitter 20 is not limited to this exemplary type, but may be cube-shaped, plate-shaped, or in any other shape. In the example of FIG. 2, the first polarized light (S-polarized light) beam 11 having been reflected by the reflection/transmission plane 20R of the polarization beam splitter 20 travels in a first direction of travel F, indicated with a blank arrow. On the other hand, the second polarized light (P-polarized light) beam 12 having been transmitted through the reflection/transmission plane 20R of the polarization beam splitter 20 travels in the positive direction of the Z axis. However, the respective directions of travel of the first polarized light (S-polarized light) beam 11 and the second polarized light (P-polarized light) beam 12 can be changed with an optical element such as a mirror, for example.

FIG. 1 is referred to again. The wavelength beam com-bining device 100 includes a first polarization conversion element 30 to convert the plurality of second polarized light (P-polarized light) beams 12 into a plurality of third polar-ized light (S-polarized light) beams 13, which are linearly polarized in the first polarization direction (Y axis direction). The first polarization conversion element 30 is a half-wave plate (half-wavelength phase plate), for example. The half-wave plate has birefringence to provide a phase difference between two orthogonal components of an electromagnetic wave that travels along the thickness direction. By disposing the half-wave plate such that the slow axis or the fast axis of the half-wave plate makes an angle of 45° with the polar-ization direction of each second polarized light (P-polarized light) beam 12, the half-wave plate can convert P-polarized light into S-polarized light.

Thus, from the plurality of laser beams 10 that as a whole are unpolarized light, the wavelength beam combining device 100 according to the present embodiment is able to produce a plurality of first polarized light beams 11 and a plurality of third polarized light beams 13 that are linearly polarized in the same specific direction. At this point, the plurality of first polarized light beams 11 are composed of a plurality of laser beams having different peak wavelengths and not being coaxially combined. Similarly, the plurality of third polarized light beams 13 also are composed of a plurality of laser beams having different peak wavelengths and not being coaxially combined.

The phase difference caused by the half-wave plate is dependent on the wavelength of incident light. Therefore, when three laser beams having respective peak wavelengths of $\lambda 1$, $\lambda 2$ and $\lambda 3$ are transmitted through the half-wave plate, a phase difference of a ½ wavelength may not be accurately created at every peak wavelength, and the resultant S-po-larized light into which the P-polarized light has been converted may have some P-polarized light component. Therefore, the plurality of third polarized light (S-polarized light) beams 13 that are emitted from the first polarization conversion element 30 may have some P-polarized light component, and in more detail, may contain elliptically polarized light. However, so long as all of the plurality of peak wavelengths $\lambda n$ are contained within a relatively narrow range, e.g., a range of 10 nm or less, the variation in the phase difference provided by the half-wave plate (wave-length dispersion) is sufficiently small. Therefore, in an embodiment of the present disclosure, the third polarized light beams 13 may mainly contain an S-polarized compo-nent, while also partially containing a P-polarized compo-nent.

The wavelength beam combining device 100 in FIG. 1 further includes two diffraction gratings 40 for coaxially combining the plurality of first polarized light (S-polarized light) beams 11 and coaxially combining the plurality of third polarized light (S-polarized light) beams 13. One of the two diffraction gratings 40 is configured to diffract the plurality of first polarized light beams 11 to generate a first wavelength-combined beam 21, into which the plurality of first polarized light beams 11 have been coaxially combined, whereas the other diffraction grating 40 is configured to diffract the plurality of third polarized light beams 13 to generate a second wavelength-combined beam 22, into which the plurality of third polarized light beams 13 have been coaxially combined.

Figure 3A:
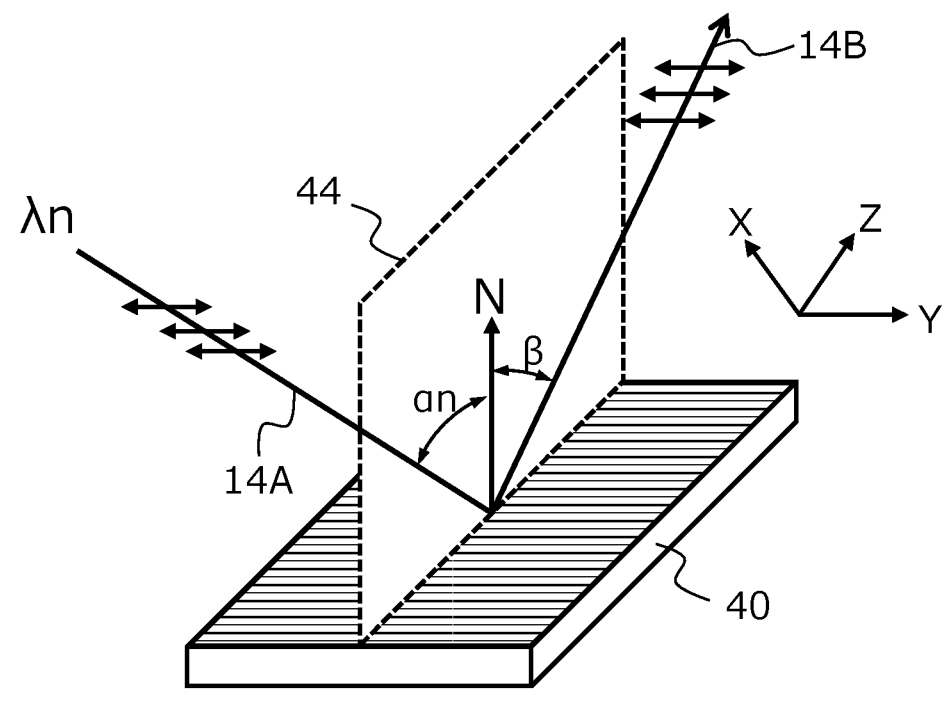
FIG. 3A is a perspective view schematically showing a manner in which a ray having a peak wavelength $\lambda n$ is incident on and diffracted by a diffraction grating, whereby a diffracted ray is produced.

Next, with reference to FIG. 3A, an example structure and functions of a diffraction grating 40 will be described. The diffraction grating 40 shown in FIG. 3A is the diffraction grating 40 that diffracts the first polarized light beams 11 in FIG. 1. The following description also applies to the other diffraction grating 40.

FIG. 3A is a perspective view schematically showing a manner in which a ray 14A having a peak wavelength λn is incident on and diffracted by the diffraction grating 40, whereby a diffracted ray 14B is produced. It is assumed that the ray 14A has an incident angle αn. In the incident angle αn, "n" refers to the same integer as "n" in the corresponding peak wavelength λn. The incident angle αn is an angle that is made by the normal direction N of the diffraction plane of the diffraction grating 40 and the ray 14A having the peak wavelength λn. A multitude of diffraction grooves are provided on the surface of the diffraction grating 40. FIG. 3A illustrates a plane 44. This plane 44 is a plane containing the ray 14A incident on the diffraction grating 40 and the diffracted ray 14B going out from the diffraction grating 40, and is orthogonal to the diffraction grooves. Because diffraction refers to a wavelength-dependent variation (dispersion) in the angle between the ray 14A and the diffracted ray 14B within the plane 40, the directions in which the plane 40 extends may be referred to as "directions of dispersion."

Assuming that the diffracted ray 14B has a diffraction angle β, the relationship of eq. 1 below holds true.

$$\sin(\alpha n) + \sin(\beta) = N \cdot m \cdot \lambda n \qquad \text{(eq. 1)}$$

Herein, N is the quantity of diffraction grooves per mm of the diffraction grating 40, and m is the number of diffraction order.

For example, given that the number of diffraction order m is 1 and that the diffraction angle β is 45.0 degrees, the incident angle αn is 24.7 degrees if N=2500 and wavelength λn=450 nm. When a plurality of laser beams of respectively different peak wavelengths λn are incident at the same position of the diffraction grating 40, appropriately choosing the wavelength λn and the incident angle αn allows the plurality of laser beams of respectively different peak wavelengths λn to be diffracted in a direction with the same diffraction angle β.

Figure 3B:
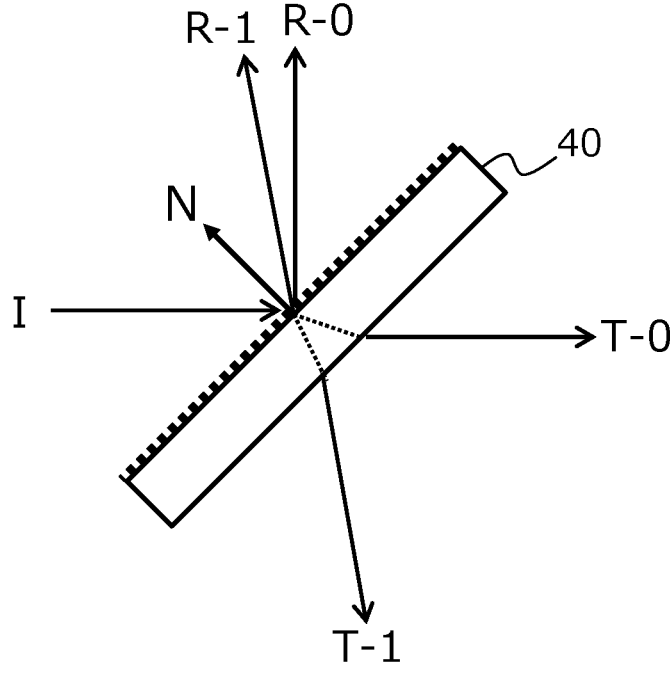
FIG. 3B is a cross-sectional view schematically showing main diffracted rays that are generated when a ray is incident on a transmission-type diffraction grating.

FIG. 3B is a cross-sectional view schematically showing main diffracted rays that are generated when a ray I is incident on a transmission-type diffraction grating 40. FIG. 3B depicts a reflective $0^{th}$ order diffracted ray R-0, a reflective $1^{st}$ order diffracted ray R-1, a transmissive $0^{th}$ order diffracted ray T-0, and a transmissive $1^{st}$ order diffracted ray T-1, which are created by the diffraction grating 40. Even as a transmission-type diffraction grating, the diffraction grating 40 used in the present embodiment is configured so as to selectively generate a strong reflective $1^{st}$ order diffracted ray R-1. This means that the reflective $0^{th}$ order diffracted ray R-0, the transmissive $0^{th}$ order diffracted ray T-0, and the transmissive $1^{st}$ order diffracted ray T-1 (which are generated by the transmission-type diffraction grating 40) are negligible. As a result, most of the laser beam that is incident on the diffraction grating is unabsorbed by the material composing the diffraction grating 40, whereby losses of light are suppressed. Unlike a transmission-type diffraction grating, a reflection-type diffraction grating includes a member for causing reflection (a multilayer dielectric film or a mirror), and this member has a non-negligible light absorption. Therefore, a reflection-type diffraction grating may allow the performance of the diffraction grating to be deteriorated by the heat generated through light absorption, as the incident laser beam intensity increases. Accordingly, in embodiments of the present disclosure, it is desirable to use a transmission-type diffraction grating. The base material of the diffraction grating 40 may be a material having low absorptance at the peak wavelength of the laser beam, e.g., quartz. The grating has a rectangular or trapezoidal cross-sectional shape, for example.

Note that a light absorbing member may be provided on an inner lateral surface of a housing that houses component elements of the wavelength beam combining device 100. The light absorbing member absorbs diffracted rays other than the reflective $1^{st}$ order diffracted ray R-1, which reduces generation of stray light.

Next, FIG. 1 is referred to again. In an embodiment of the present disclosure, the incident angles (an) of the plurality of first polarized light beams 11 being incident on the left diffraction grating 40 are determined so as to satisfy eq. 1, in accordance with their wavelengths λn (=λ1, λ2, λ3). Similarly, the incident angles (an) of the plurality of third polarized light beams 13 being incident on the right diffraction grating 40 are determined so as to satisfy eq. 1, in accordance with their wavelengths λn (=λ1, λ2, λ3). This allows for producing the first wavelength-combined beam 21 and the second wavelength-combined beam 22, each of which is coaxialized so as to result in an equal diffraction angle (β). On the face of each diffraction grating 40 having the diffraction grooves formed thereon, the first polarized light beams 11 and the third polarized light beams 13 each have a diameter (beam diameter) in the range of e.g. not less than 0.5 mm and not more than 10 mm.

In the present embodiment, the laser beams that are incident on the diffraction gratings 40 are the first polarized light beams 11, which are S-polarized light, and the third polarized light beams 13, which are S-polarized light. When each diffraction grating 40 has polarization dependence, if laser beams of unpolarized light are incident thereon, the diffraction efficiency may deteriorate depending on their polarized component. In the present embodiment, each diffraction grating 40 has diffraction grooves that are parallel to the first polarization direction (Y axis direction). In the present embodiment, the use of diffraction gratings 40 each having a higher diffraction efficiency for S-polarized light than for P-polarized light restrains light losses from occurring at the diffraction grating 40.

As for each laser beam 10, assuming that it has a spectral width Δλn substantially centered around the peak wavelength λn, its spectral width Δλn is preferably kept as small as possible. When the spectral width Δλn increases, the diffraction angle β will have a greater range. The diffraction angle β having a larger range results in each of the first wavelength-combined beam 21 and the second wavelength-combined beam 22 having a larger range of directions of travel. The spectral width Δλn may be set to be e.g. 0.3 nm or less. Combining a plurality of laser beams 10 each having a narrow spectral width Δλn allows for producing a wavelength-combined beam having a plurality of peak wavelengths in a desired wavelength range, thus efficiently enhancing the optical output power thereof. In applications where metals such as Cu are processed or welded, the plurality of peak wavelengths may be contained within the range from 430 nm to 480 nm, for example. There may be ten or more laser beams 10.

The wavelength beam combining device 100 further includes a second polarization conversion element 50 and a polarization beam combiner 60. The second polarization conversion element 50 is configured to change the polarization state of the first wavelength-combined beam 21 or the second wavelength-combined beam 22 so that the polarization directions of the first wavelength-combined beam 21 and the second wavelength-combined beam 22 become orthogonal to each other. The second polarization conversion element 50 may be e.g. a half-wave plate (half-wavelength phase plate), similarly to the first polarization conversion element 30. In the example of FIG. 1, the second polarization conversion element 50 is disposed so as to rotate the polarization direction of the second wavelength-combined beam 22 by 90 degrees. The second wavelength-combined beam 22 having been transmitted through the second polarization conversion element 50 is linearly polarized in the second polarization direction. Alternatively, the second polarization conversion element 50 may be disposed in a position for rotating the polarization direction of the first wavelength-combined beam 21 by 90 degrees.

The polarization beam combiner 60 is configured to generate a third wavelength-combined beam 23, into which the first wavelength-combined beam 21 and the second wavelength-combined beam 22 have been coaxially combined. The polarization beam combiner 60 may have a similar structure to that of the polarization beam splitter 20. In general, a polarization beam splitter can also be used as a polarization beam combiner. In the example of FIG. 1, the first wavelength-combined beam 21 is S-polarized light, whereas the second wavelength-combined beam 22 having been transmitted through the second polarization conversion element 50 is P-polarized light. The polarization beam combiner 60 includes a reflection/transmission plane 60R that reflects S-polarized light and transmits P-polarized light. With this structure, the polarization beam combiner 60 is able to emit the third wavelength-combined beam 23, into which the first wavelength-combined beam 21 (which is S-polarized light) and the second wavelength-combined beam 22 (which is P-polarized light) have been coaxially combined.

The third wavelength-combined beam 23 is a laser beam into which three laser beams 10 having respective peak wavelengths of λ1, λ2 and λ3 have been wavelength-combined. Thus, the wavelength beam combining device 100 allows for enhancing the output power and power density of wavelength-combined laser beams. As the quantity of laser beams 10 to be combined increases, the output power and power density of the third wavelength-combined beam 23 can proportionately increase.

Conversely to the example illustrated above, the reflection/transmission plane 20R of the polarization beam splitter 20 may cause the second polarized light (P-polarized light) beam 12 to be reflected in the first direction of travel F and allow the first polarized light (S-polarized light) beam 11 to be transmitted in the positive direction of the Z axis. In this case, the first polarization conversion element 30 is disposed at a position for transmitting the plurality of second polarized light (P-polarized light) beams 12, and converts the plurality of second polarized light (P-polarized light) beams 12 into a plurality of third polarized light (S-polarized light) beams 13 that have been linearly polarized in the first polarization direction (Y axis direction).

Figure 4A:
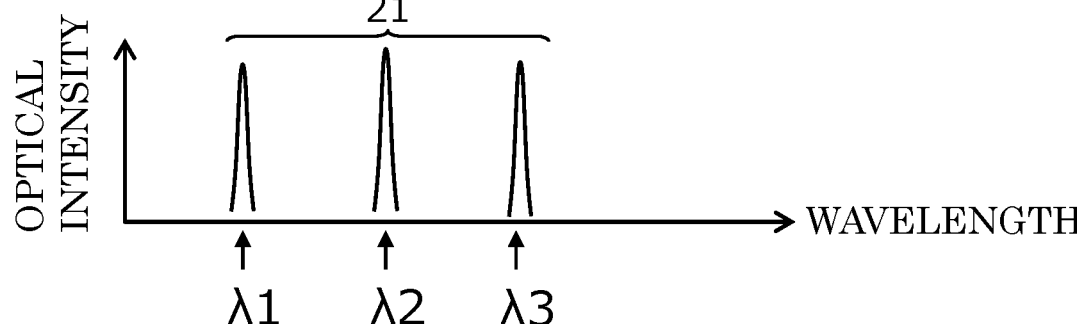
FIG. 4A is a graph schematically showing a spectrum of a first wavelength-combined beam, into which three laser beams having respective peak wavelengths of $\lambda 1$, $\lambda 2$ and $\lambda 3$ are wavelength-combined.
Figure 4B:
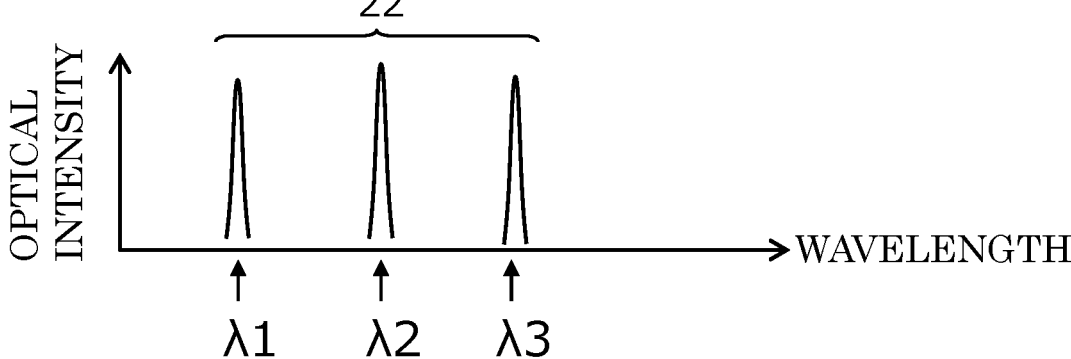
FIG. 4B is a graph schematically showing a spectrum of a second wavelength-combined beam, into which three laser beams having respective peak wavelengths of $\lambda 1$, $\lambda 2$ and $\lambda 3$ are wavelength-combined.

FIG. 4A is a graph schematically showing a spectrum of the first wavelength-combined beam 21, into which three laser beams 10 having respective peak wavelengths of λ1, λ2 and λ3 are wavelength-combined. In the graph, the vertical axis represents optical intensity, and the horizontal axis represents wavelength. FIG. 4B is a graph schematically showing a spectrum of the second wavelength-combined beam 22, into which three laser beams 10 having respective peak wavelengths of λ1, λ2 and λ3 are wavelength-combined. In the graph, the vertical axis represents optical intensity, and the horizontal axis represents wavelength. The optical intensity of the third wavelength-combined beam 23, into which the first wavelength-combined beam 21 and the second wavelength-combined beam 22 are coaxially combined, is equal to a total of the optical intensity shown in FIG. 4A and the optical intensity shown in FIG. 4B, where light losses associated with the polarization beam combiner 60 are ignored.

Figure 5:
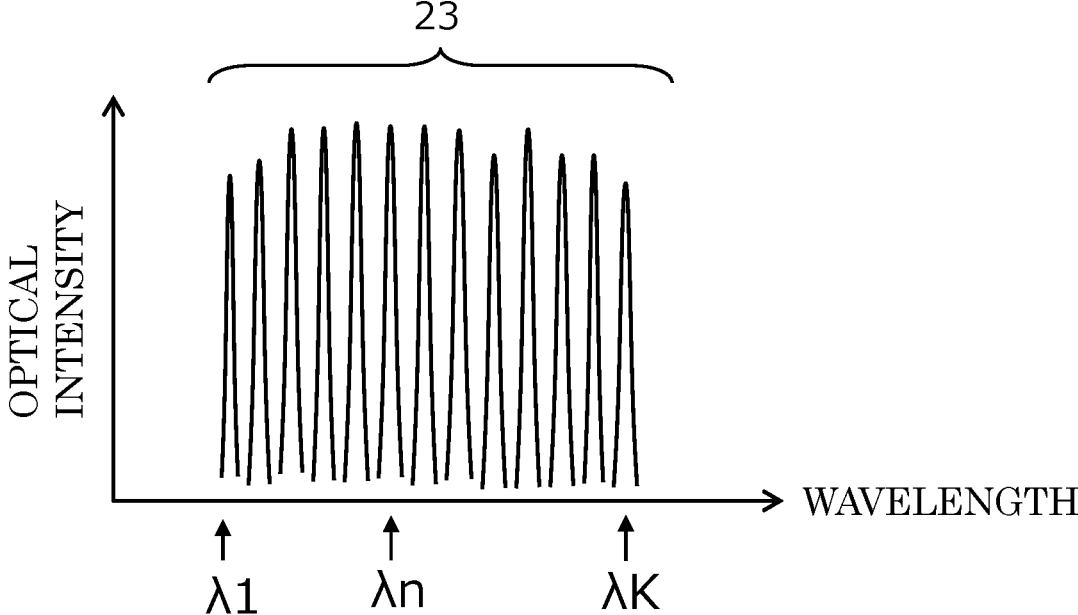
FIG. 5 is a graph schematically showing a spectrum of a third wavelength-combined beam in the case where there are K laser beams to be combined (where K is an integer of 4 or more).

FIG. 5 is a graph schematically showing a spectrum of the third wavelength-combined beam 23 in the case where there are K laser beams 10 to be combined (where K is an integer of 4 or more). In the graph, the vertical axis represents optical intensity, and the horizontal axis represents wavelength. By increasing the quantity of laser beams 10 to be combined, the optical output power and power density can be increased. In order to combine the plurality of laser beams 10 within a predetermined wavelength range, the interval between the peak wavelengths of the laser beams 10 may be narrowed.

The wavelength beam combining device according to the present embodiment provides an enhanced diffraction efficiency by using diffraction gratings that are suitable for the polarization states of incident light, and coaxializes the diffracted light generated by such diffraction gratings, thereby enhancing the output power and power density.

Second Embodiment of Wavelength Beam Combining Device

Next, with reference to FIG. 6 and FIG. 7, a second embodiment of a wavelength beam combining device according to the present disclosure will be described.

Figure 6:
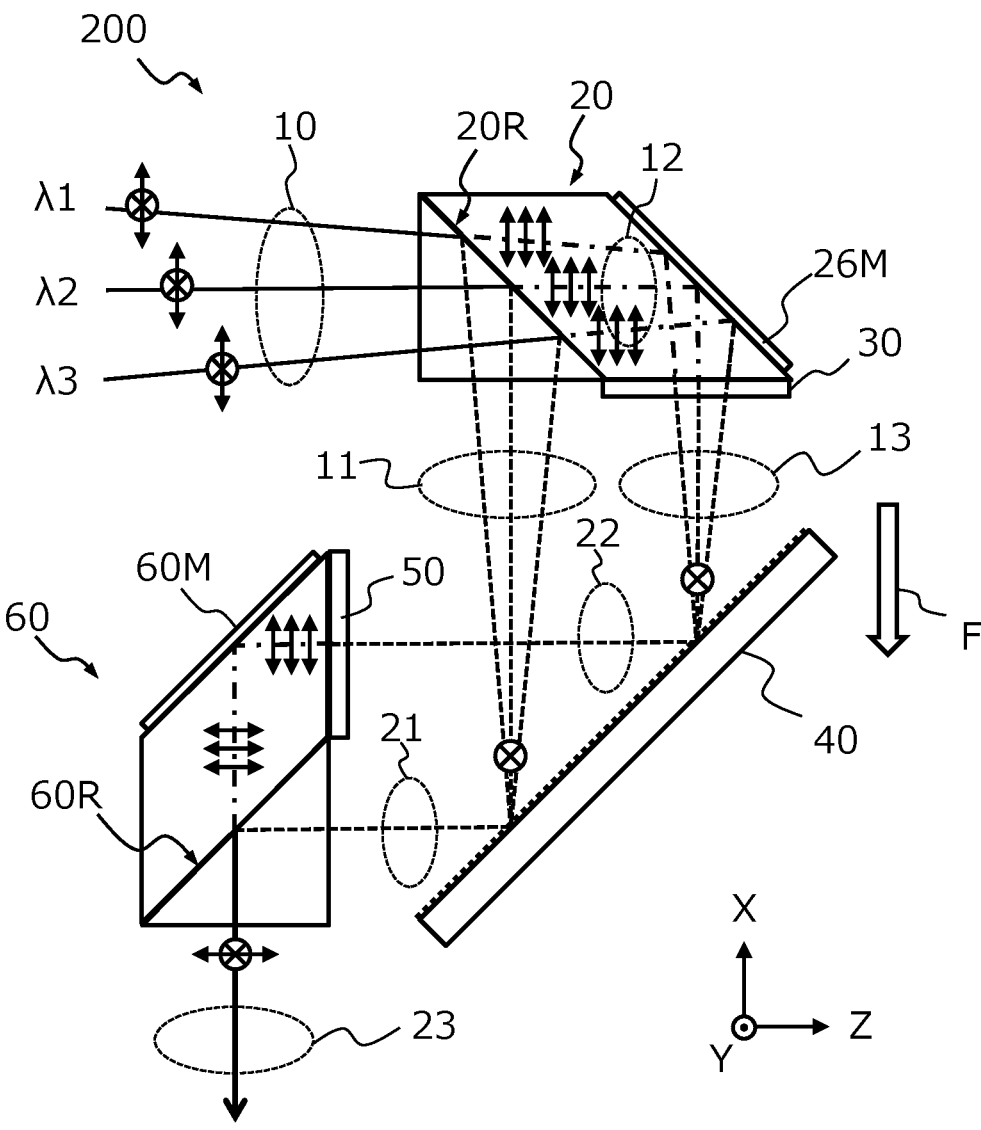
FIG. 6 is a diagram showing an example structure of a second embodiment of a wavelength beam combining device according to the present disclosure.
Figure 7:
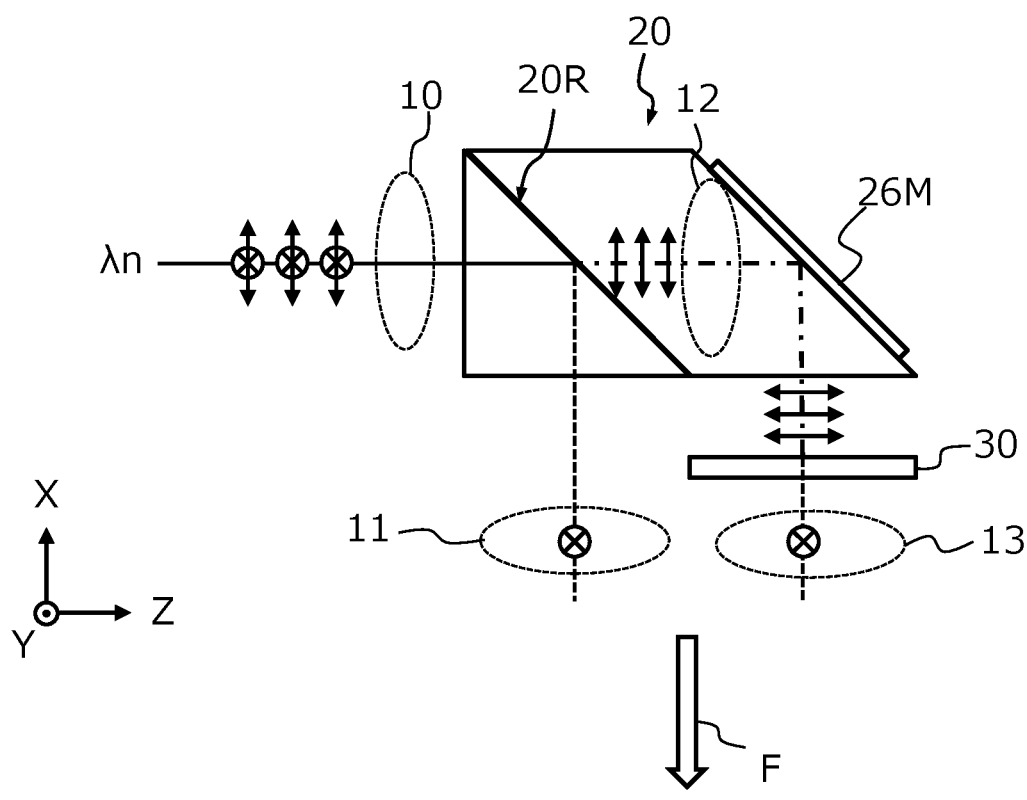
FIG. 7 is a side view showing an example structure of the polarization beam splitter.

Similarly to the first embodiment, the wavelength beam combining device 200 according to the present embodiment shown in FIG. 6 is able to combine a plurality of laser beams 10 of respectively different peak wavelengths.

The wavelength beam combining device 200 in FIG. 6 includes a polarization beam splitter 20 that separates a plurality of laser beams 10 of respectively different peak wavelengths into: a plurality of first polarized light beams 11 that are linearly polarized in the first polarization direction (Y axis direction), and a plurality of second polarized light beams 12 that are linearly polarized in a second polarization direction (a direction within the XZ plane) which is orthogonal to the first polarization direction. As specifically shown in FIG. 7, the polarization beam splitter 20 includes: a reflection/transmission plane 20R that separates incident laser beams 10 into first polarized light (S-polarized light) beams 11 and second polarized light (P-polarized light) beams 12; and a mirror 26M that reflects the second polarized light (P-polarized light) beam 12 in the first direction of travel (F direction). In this example, via the reflection/transmission plane 20R, a transparent member having a cross section of a parallelogram shape is fixed to a transparent prism having a triangular cross section. The mirror 26M is fixed to a slope of the transparent member having a parallelogram cross section.

The plurality of second polarized light beams 12 having been reflected by the mirror 26M are converted by the first polarization conversion element 30 into a plurality of third polarized light beams 13 that are linearly polarized in the first polarization direction (Y axis direction).

In the wavelength beam combining device 200 of FIG. 6, a single diffraction grating 40 diffracts the plurality of first polarized light beams 11 to generate a first wavelength-combined beam 21 into which the plurality of first polarized light beams 11 have been coaxially combined, and diffracts the plurality of third polarized light beams 13 to generate a second wavelength-combined beam 22 into which the plurality of third polarized light beams 13 have been coaxially combined. The position on the diffraction grating 40 at which the plurality of first polarized light beams 11 are incident is different from the position on the diffraction grating 40 at which the plurality of third polarized light beams 13 are incident. Therefore, the diffraction grating 40 of FIG. 6 may be isolated into a first diffraction grating on which the plurality of first polarized light beams 11 are incident and a second diffraction grating on which the plurality of third polarized light beams 13 are incident. When the plurality of laser beams 10 have an increased output power as a whole, they may cause a local increase in the temperature of the diffraction grating 40 on which they are incident, thereby deforming the diffraction grating 40 through thermal expansion. Such deformation may lower the diffraction efficiency, and degrade the performance of the diffraction grating 40. In the present embodiment, even in this implementation where a single diffraction grating 40 is used, the respective polarized light beams are incident separately on different regions of the diffraction grating 40, so that the aforementioned degradation in the performance of the diffraction grating 40 can be suppressed even when the plurality of laser beams 10 have an increased output power as a whole.

Also the wavelength beam combining device 200 of FIG. 6 includes: a second polarization conversion element 50 that changes the polarization state of the first wavelength-combined beam 21 or the second wavelength-combined beam 22 so that the polarization directions of the first wavelength-combined beam 21 and the second wavelength-combined beam 22 become orthogonal to each other; and a polarization beam combiner 60 that generates and emits a third wavelength-combined beam 23 into which the first wavelength-combined beam 21 and the second wavelength-combined beam 22 have been coaxially combined.

While the polarization beam combiner 60 according to the present embodiment has the same structure as that of the polarization beam splitter 20, the orientation of the polarization beam combiner 60 is rotated by 90 degrees around the Y axis therefrom. In this example, the mirror 60M fixed to the polarization beam combiner 60 reflects the second wavelength-combined beam 22, thereby allowing the first wavelength-combined beam 21 and the second wavelength-combined beam 22 to be coaxially combined.

The wavelength beam combining device according to the present embodiment provides an enhanced diffraction efficiency by using a diffraction grating that is suitable for the polarization states of incident light, and coaxializes the diffracted light generated by such a diffraction grating, thereby enhancing the output power and power density.

Third Embodiment of Wavelength Beam Combining Device

Next, with reference to FIG. 8, a third embodiment of a wavelength beam combining device according to the present disclosure will be described.

Figure 8:
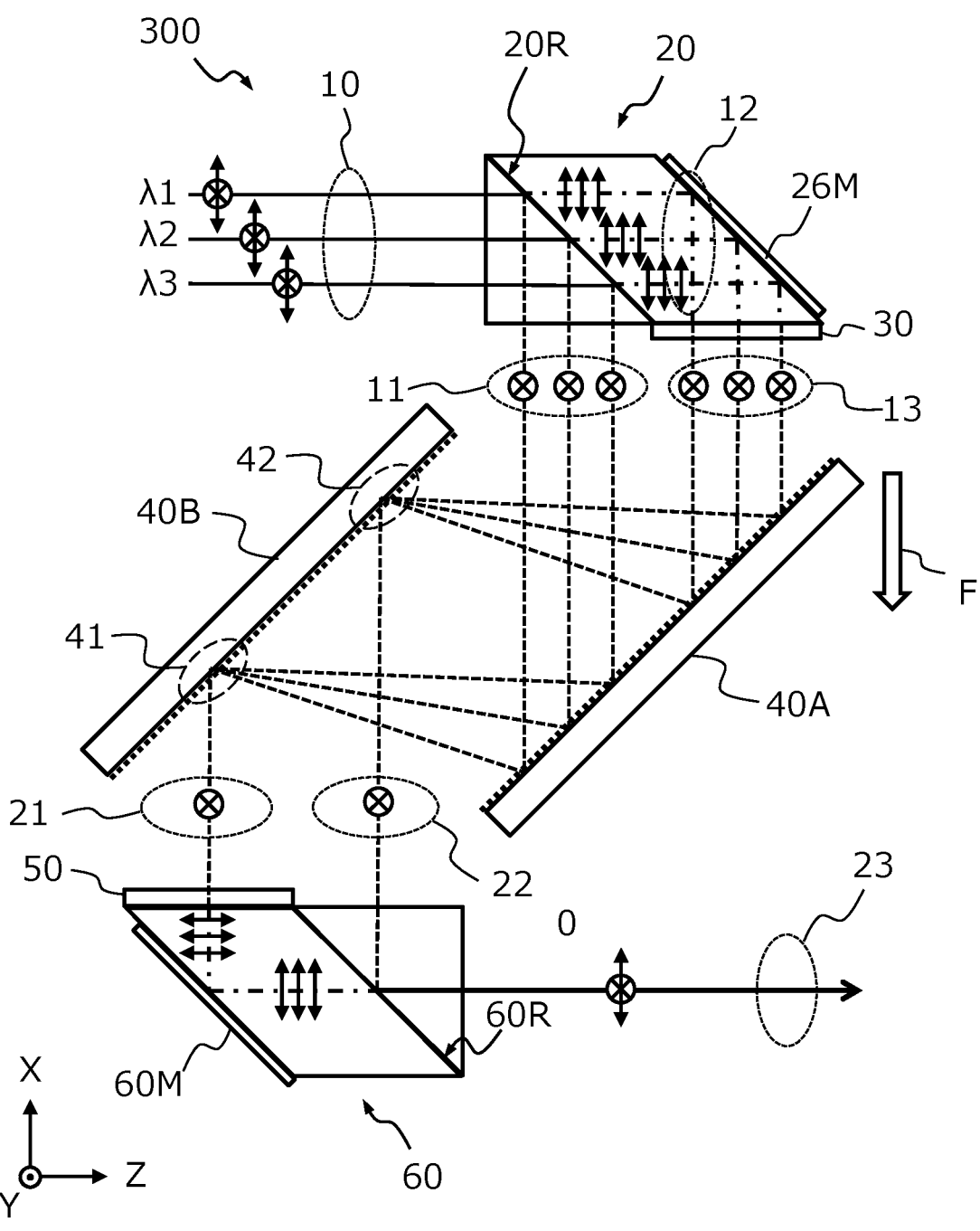
FIG. 8 is a diagram showing an example structure of a third embodiment of a wavelength beam combining device according to the present disclosure.

A wavelength beam combining device 300 according to the present embodiment shown in FIG. 8 includes the polarization beam splitter 20 in the second embodiment, but a plurality of laser beams 10 of respectively different peak wavelengths are incident on the polarization beam splitter 20 while being parallel to one another. The reflection/transmission plane 20R of the polarization beam splitter 20 reflects a plurality of first polarized light beams 11 in the first direction of travel (F direction), and transmits a plurality of second polarized light beams 12. Similarly to the wavelength beam combining device 200 of the second embodiment, the wavelength beam combining device 300 according to the present embodiment includes a mirror 26M that causes the plurality of second polarized light beams 12 having been transmitted through the reflection/transmission plane 20R of the polarization beam splitter 20 to be reflected in the first direction of travel (F direction). The plurality of second polarized light beams 12 having been reflected by the mirror 26M are converted by the first polarization conversion element 30 into a plurality of third polarized light beams 13 that are linearly polarized in the first polarization direction (Y axis direction). As in the other embodiments, the first polarization conversion element 30 may be a half-wave plate (half-wavelength phase plate), for example.

In the present embodiment, unlike in the second embodiment, the plurality of first polarized light beams 11 and the plurality of third polarized light beams 13, both traveling in the first direction of travel (F direction), are parallel light beams.

The wavelength beam combining device 300 according to the present embodiment includes a diffraction grating that includes: a first diffraction grating 40A disposed at a position for receiving the plurality of first polarized light beams 11 having been reflected by the polarization beam splitter 20 in the first direction of travel (F direction) and the plurality of third polarized light beams 13 emitted from the first polarization conversion element 30 in the first direction of travel (F direction), and a second diffraction grating 40B disposed in parallel to the first diffraction grating 40A. The second diffraction grating 40B includes: a first region 41 to receive reflection-diffracted light generated by the first diffraction grating 40A from the plurality of first polarized light beams 11 and to emit a first wavelength-combined beam 21 in the first direction of travel (F direction), and a second region 42 to receive reflection-diffracted light generated by the first diffraction grating 40A from the plurality of third polarized light beams 13 and to emit a second wavelength-combined beam 22 in the first direction of travel (F direction).

The structure of the first diffraction grating 40A and the second diffraction grating 40B is designed based on eq. 1 above. More specifically, the first diffraction grating 40A and the second diffraction grating 40B are disposed in parallel to each other, and have the same quantity N of diffraction grooves per mm. Furthermore, the first diffraction grating 40A is disposed so that the plurality of first polarized light beams 11 and the plurality of third polarized light beams 13 are both incident thereon at an incident angle $\alpha$ (e.g. 45 degrees). The first diffraction grating 40A is configured so as to cause the plurality of first polarized light beams 11 and the plurality of third polarized light beams 13, which are incident while being parallel to one another and at the same incident angle $\alpha$, to be diffracted at respectively different diffraction angles $\beta n$ corresponding to their respective peak wavelengths $\lambda n$ and be incident at predetermined positions on the opposing second diffraction grating 40B. The second diffraction grating 40B, having the same structure as that of the first diffraction grating 40A, is configured to emit the reflection-diffracted light from the first diffraction grating 40A (which is incident at a different incident angle (n depending on the peak wavelength λn) all at the same diffraction angle α (e.g. 45 degrees). Thus, with the action of the pair of diffraction gratings 40A and 40B, the coaxialized first wavelength-combined beam 21 and the coaxialized second wavelength-combined beam 22 can be emitted in the first direction of travel (F direction).

As described above, the first diffraction grating 40A and the second diffraction grating 40B are under a parallel relationship such that their respective dispersion directions are contained in the same plane. In other words, the first diffraction grating 40A and the second diffraction grating 40B are disposed in parallel to each other, so as to share the plane 44 shown in FIG. 3A. In this case, the angle of incidence to the first diffraction grating 40A and the angle of diffraction from the second diffraction grating 40B are the same angle. Because this relationship is maintained regardless of the wavelength, even if the plurality of laser beams fluctuate in wavelength, the angle of diffraction from the second diffraction grating 40B can be kept constant, thus facilitating convergence onto an optical fiber.

Note that the degree of parallelism between the first diffraction grating 40A and the second diffraction grating 40B is to be evaluated in terms of the angle between a first normal to the face of the first diffraction grating 40A having the diffraction grooves formed thereon and a second normal to the face of the second diffraction grating 40B having the diffraction grooves formed thereon. In an embodiment of the present disclosure, the angle between the first normal and the second normal is preferably within a range of 180 degrees±1 degree.

The wavelength beam combining device 300 of FIG. 8 similarly includes: a second polarization conversion element 50 that changes the polarization state of the first wavelength-combined beam 21 or the second wavelength-combined beam 22 so that the polarization directions of the first wavelength-combined beam 21 and the second wavelength-combined beam 22 become orthogonal to each other; and a polarization beam combiner 60 that generates and emits a third wavelength-combined beam 23 into which the first wavelength-combined beam 21 and the second wavelength-combined beam 22 have been coaxially combined. In the example of FIG. 8, the polarization beam combiner 60 has the same structure as that of the polarization beam splitter 20, its orientation is rotated by 180 degrees around the Y axis therefrom.

The wavelength beam combining device according to the present embodiment provides an enhanced diffraction efficiency by using diffraction gratings that are suitable for the polarization states of incident light, and coaxializes the diffracted light generated by such diffraction gratings, thereby enhancing the output power and power density.

Embodiment of Direct Diode Laser Device

Hereinafter, with reference to FIG. 9, one embodiment of a direct diode laser device will be described.

A direct diode laser device 1000 according to the present embodiment includes: a wavelength beam combining device 400; a plurality of semiconductor laser devices 72 that emit laser light of respectively different peak wavelengths; and an optical fiber array device 70 configured to generate, from the laser light emitted from the plurality of semiconductor laser devices 72, laser beams 10 to be incident on a polarization beam splitter 20 of the wavelength beam combining device 400. The laser light emitted from each semiconductor laser device 72 is optically coupled to a corresponding optical fiber 74 of the optical fiber array device 70. Each of the plurality of semiconductor laser devices 72 is configured to lase in a single longitudinal mode of a respectively different peak wavelength. Each peak wavelength is contained within the range from 430 nm to 480 nm, for example. Even when the laser light emitted from each semiconductor laser device 72 is linearly polarized light, unless the optical fibers 74 are polarization-maintaining fibers, the polarization state of the laser light will change in the process of passing through the optical fibers 74. Therefore, each of the plurality of laser beams 10 generated by the optical fiber array device 70 according to the present embodiment is unpolarized light.

Examples of semiconductor laser devices 72 lasing in a single longitudinal mode include External Cavity Laser (ECL) devices, Distributed Feedback (DFB) laser devices, and Distributed Bragg Reflector (DBR) laser devices.

By using the optical fiber array device 70, the optical fibers 74 can be aligned, and adjustment of the outgoing angle of the laser beam 10 is facilitated. This makes it easier for the optical fiber array device 70 to emit the plurality of laser beams 10 in parallel with a high accuracy, for example. In the case where the optical fiber array device 70 is used, optical fibers extending from laser light sources can be connected to the optical fibers 74 of the optical fiber array device 70 by being fused onto them. The optical fiber array device 70 includes a lens system to collimate laser light emitted from the tip end of each optical fiber 74.

Similarly to the third embodiment, the wavelength beam combining device 400 according to the present embodiment includes the polarization beam splitter 20. However, the polarization beam splitter 20 in the present embodiment is plate-shaped. A plurality of laser beams 10 of respectively different peak wavelengths, emitted from the optical fiber array device 70 in parallel to a second direction of travel that is orthogonal to a first direction of travel (F direction), are incident onto this plate-shaped polarization beam splitter 20 while being parallel to one another. The reflection/transmission plane 20R of the polarization beam splitter 20 reflects the plurality of first polarized light beams 11 in the first direction of travel (F direction), while transmitting the plurality of second polarized light beams 12. When the polarization beam splitter 20 is plate-shaped, as compared to the polarization beam splitter 20 in the earlier embodiment, a smaller portion of the second polarized light beams 12 is absorbed by the polarization beam splitter 20, loss of optical energy is suppressed, and increase in the temperature of the polarization beam splitter 20 can also be suppressed. As each laser beam 10 to be combined increases in optical energy, and as the quantity of laser beams 10 to be combined increases, it becomes more desirable to suppress heating of the optical elements within the device that is caused by absorption of optical energy as much as possible.

The wavelength beam combining device 400 includes a mirror 26M that causes the plurality of second polarized light beams 12 having been transmitted through the reflection/transmission plane 20R of the polarization beam splitter 20 to be reflected in the first direction of travel (F direction). The mirror 26M is also plate-shaped. The plurality of second polarized light beams 12 having been reflected by the plate-shaped mirror 26M are converted by the first polarization conversion element 30 into a plurality of third polarized light beams 13 that are linearly polarized in the first polarization direction (Y axis direction). As in the other embodiments, the first polarization conversion element 30 may be a half-wave plate (half-wavelength phase plate), for example. As in the third embodiment, the plurality of first polarized light beams 11 and the plurality of third polarized light beams 13, both traveling in the first direction of travel (F direction), are parallel light beams in the present embodiment.

The wavelength beam combining device 400 includes: a first diffraction grating 40A disposed in a position for receiving the plurality of first polarized light beams 11 having been reflected by the polarization beam splitter 20 in the first direction of travel (F direction) and the plurality of third polarized light beams 13 emitted from the first polarization conversion element 30 in the first direction of travel (F direction); and a second diffraction grating 40B disposed in parallel to the first diffraction grating 40A. In the present embodiment, each of the first diffraction grating 40A and the second diffraction grating 40B is a transmission-type diffraction grating.

The second diffraction grating 40B includes: a first region 41 to receive reflection-diffracted light generated by the first diffraction grating 40A from the plurality of first polarized light beams 11 and to emit a first wavelength-combined beam 21 in the first direction of travel (F direction); and a second region 42 to receive reflection-diffracted light generated by the first diffraction grating 40A from the plurality of third polarized light beams 13 and to emit a second wavelength-combined beam 22 in the first direction of travel (F direction). In the second diffraction grating 40B, the first region 41 and the second region 42 are two elements that are isolated by an interspace. The diffraction grooves in each of the first region 41 and the second region 42 are parallel to the first polarization direction (Y axis direction). The diffraction grooves in each of the first region 41 and the second region 42 have a grating pitch of e.g. not less than 200 nm and not more than 500 nm. When the quantity of diffraction grooves in each of the first region 41 and the second region 42 is e.g. not less than 2000 and not more than 5000, the size of each of the first region 41 and the second region 42 (length along a direction orthogonal to the diffraction grooves), is restricted to e.g. 15 mm or less. Reducing the size of the region of the second diffraction grating 40B in which reflection-diffracted light from the first diffraction grating 40A gathers provides the following effect: when the peak wavelength(s) of a laser beam(s) deviates from the design value(s), reflection-diffracted light from the first diffraction grating 40A will not strike the first region 41 and the second region 42, thereby suppressing degradations in beam quality. A degraded beam quality may allow the wavelength-combined beam having been converged by the converging lens 80 to irradiate portions of an optical transmission fiber 90 other than its core, thereby damaging the optical transmission fiber 90. At the rear face side of the second diffraction grating 40B, a light absorbing member or the like is preferably provided to absorb any reflection-diffracted light that has missed the first region 41 and the second region 42.

The wavelength beam combining device 400 may further include a stop (pinhole element) 95 for at least one of the first wavelength-combined beam 21, the second wavelength-combined beam 22, and the third wavelength-combined beam 23. For example, by disposing the pinhole element 95 at a position shown in FIG. 9, the third wavelength-combined beam 23 having been converged by the converging lens 80 is restrained from irradiating portions of the optical transmission fiber 90 other than its core and damaging the optical transmission fiber 90. The pinhole diameter of the pinhole element 95 may be in the range of e.g. not less than 1.0 mm and not more than 5 mm. The pinhole element 95 may be provided at a position for functioning as a stop for the first wavelength-combined beam 21, or at a position for functioning as a stop for the second wavelength-combined beam 22. There may be more than one pinhole element 95.

In the present embodiment, optical elements such as the polarization beam splitter 20, the mirror 26M, the diffraction gratings 40A and 40B, and the polarization conversion elements 30 and 50 are all plate-shaped. In the case where the peak wavelengths of the laser beams are contained in the blue band, these optical elements may be made of a material that is unlikely to absorb light in the blue band, e.g., quartz. Reducing thickness of these optical elements thin and allowing them to be integrated within a predetermined space not only contributes to reduction in size of the device, but also facilitates adjusting the temperatures of a plurality of optical elements as a whole.

The third wavelength-combined beam 23 is coupled to the optical transmission fiber 90 by the converging lens 80. Examples of the optical transmission fiber 90 that are suitable for high-power optical transmission in the blue band include optical fibers having a "high OH-pure quartz" core with a high content of OH groups, coreless fibers, and photonics crystal fibers.

Figure 9:
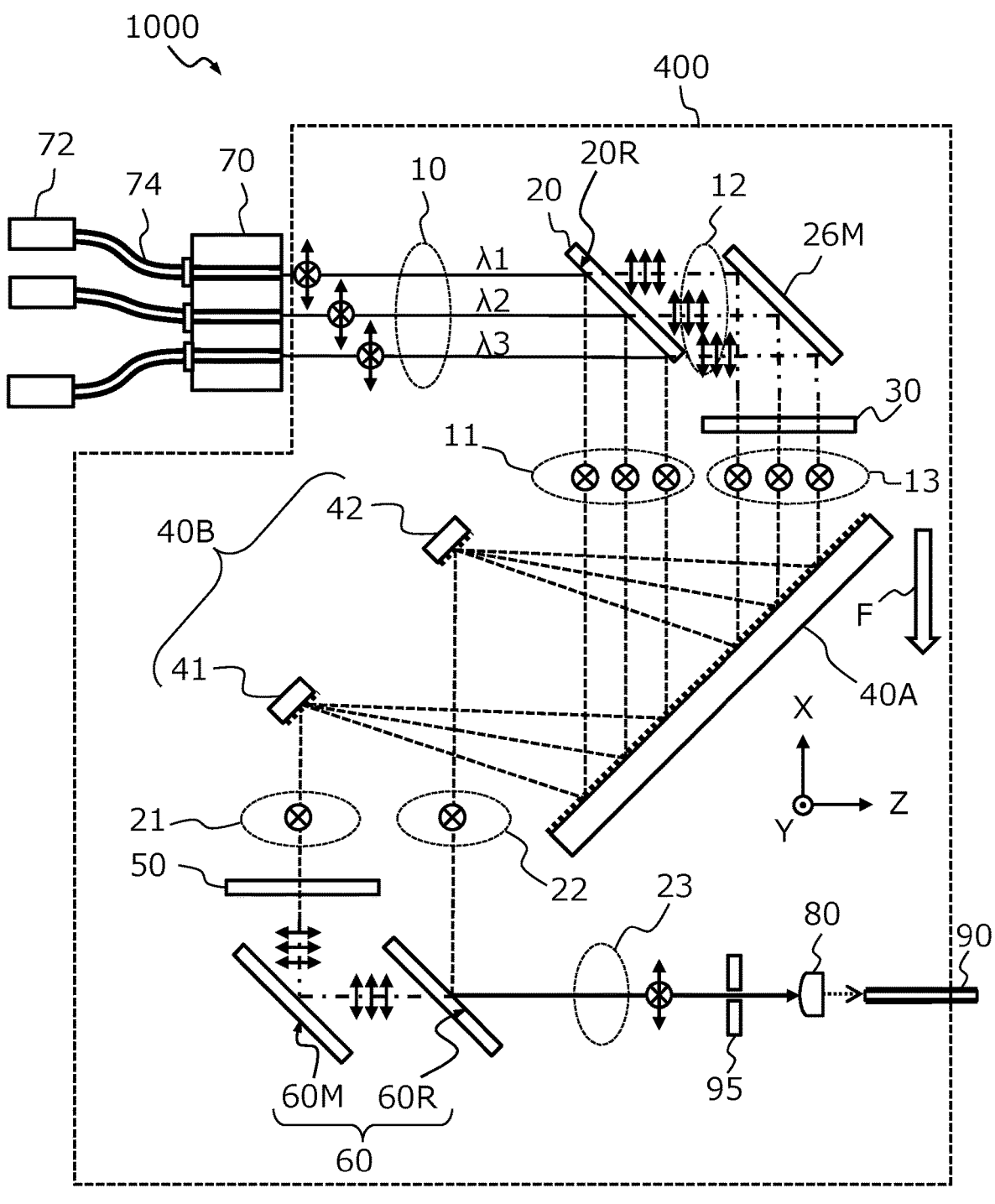
FIG. 9 is a diagram showing an example structure of an embodiment of a direct diode laser device according to the present disclosure.

The direct diode laser device according to the present disclosure is not limited to the example of including the wavelength beam combining device 400 having the structure shown in FIG. 9; instead, it may include the wavelength beam combining devices 100, 200 and 300 from the other embodiments, or any modified examples thereof.

With the direct diode laser device according to the present embodiment, even if the laser light emitted from each of the plurality of semiconductor laser devices has its polarization state converted by the optical fiber array device into unpolarized light, it is then converted into linearly polarized light by the polarization beam splitter, which allows the use of diffraction gratings that are suited to the respective polarization states for an enhanced diffraction efficiency. Coaxializing the diffracted light that is generated by such diffraction gratings allows for enhancing the output power and power density.

Embodiment of Laser Processing Machine

Figure 10:
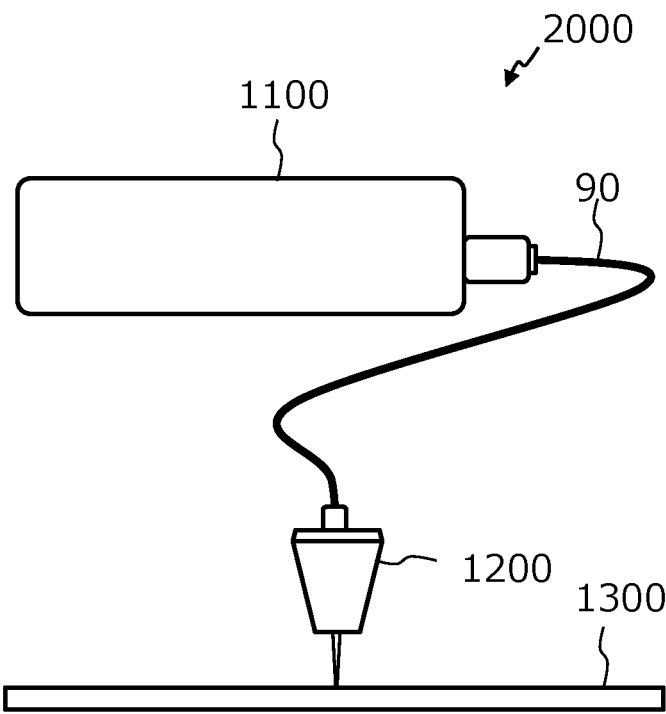
FIG. 10 is a diagram showing an example structure of an embodiment of a laser processing machine according to the present disclosure.

Next, with reference to FIG. 10, an embodiment of a laser processing machine 2000 according to the present disclosure will be described. FIG. 10 is a diagram showing an example structure of the laser processing machine 2000 according to the present embodiment.

The illustrated laser processing machine 2000 includes a light source device 1100 and a processing head 1200 that is connected to an optical transmission fiber 90 extending from the light source device 1100. The processing head 1200 irradiates a target object 1300 with a wavelength-combined beam that is emitted from the optical transmission fiber 90. While a single light source device 1100 is employed in the illustrated example, the processing head 1200 may be connected to a plurality of light source devices 1100 via the optical transmission fiber 90.

The light source device 1100 is a direct diode laser device including: a wavelength beam combining device having the aforementioned structure; and a plurality of semiconductor laser devices that emit a plurality of laser beams of respectively different peak wavelengths. The wavelength beam combining device included in the light source device 1100 may be any of the various embodiments described above, or any modified examples thereof. Any appropriate quantity of semiconductor laser devices can be mounted in the light source device 1100, and the quantity of the semiconductor laser devices may be selected in accordance with the required optical output power or irradiance. The wavelengths of the laser light to be emitted from the semiconductor laser devices may be selected in accordance with the material to be processed.

According to the present embodiment, a high-power laser beam is generated through wavelength beam combining, and is efficiently coupled to an optical fiber. Therefore, it is possible to obtain a laser beam having a high power density and high beam quality, with a high efficiency of energy conversion.

The laser beam to be emitted from the processing head 1200 may contain any laser beam other than the laser beams that have been emitted and combined from the semiconductor laser devices. For example, while the peak wavelengths of laser beams emitted from the semiconductor laser devices and wavelength-combined are contained within the range from 430 nm to 480 nm, a laser beam having a near-infrared peak wavelength may also be additionally superposed, for example. Depending on the material to be processed, a laser beam of a wavelength for which that material exhibits high absorptance may be superposed as appropriate.

Wavelength beam combining devices, direct diode laser devices, and laser processing machines according to the present disclosure can be broadly used in applications in which high-power and high-power-density laser light having a high beam quality is required, e.g., cutting and punching of various materials, localized heat treatment, surface treatment, metal welding, 3D printing, and so on.

What is claimed is:

1. A wavelength beam combining device for combining a plurality of laser beams of respectively different peak wavelengths, the wavelength beam combining device comprising:

a polarization beam splitter configured to separate the plurality of laser beams into a plurality of first polarized light beams that are linearly polarized in a first polarization direction and a plurality of second polarized light beams that are linearly polarized in a second polarization direction that is orthogonal to the first polarization direction;

a first polarization conversion element configured to convert the plurality of second polarized light beams into a plurality of third polarized light beams that are linearly polarized in the first polarization direction;

at least one diffraction grating configured to diffract the plurality of first polarized light beams and generate a first wavelength-combined beam into which the plurality of first polarized light beams are coaxially combined, and to diffract the plurality of third polarized light beams and generate a second wavelength-combined beam into which the plurality of third polarized light beams have been coaxially combined;

a second polarization conversion element configured to change a polarization state of the first wavelength-combined beam or the second wavelength-combined beam so that the polarization directions of the first wavelength-combined beam and the second wavelength-combined beam become orthogonal to each other; and a polarization beam combiner configured to generate and emit a third wavelength-combined beam into which the first wavelength-combined beam and the second wavelength-combined beam have been coaxially combined.

2. The wavelength beam combining device of claim 1, wherein:

the at least one diffraction grating comprises diffraction grooves that are parallel to the first polarization direction.

3. The wavelength beam combining device of claim 1, wherein:

the peak wavelengths are contained within a range of 430 nm to 480 nm.

4. The wavelength beam combining device of claim 1, wherein:

the plurality of laser beams includes ten or more laser beams.

5. The wavelength beam combining device of claim 1, wherein:

the polarization beam splitter is configured so that, when the plurality of laser beams are incident thereon while being parallel to one another, the polarization beam splitter reflects the plurality of first polarized light beams in a first direction of travel and transmits the plurality of second polarized light beams;

the wavelength beam combining device further comprises a mirror configured to cause the plurality of second polarized light beams that have been transmitted through the polarization beam splitter to be reflected in the first direction of travel; and the first polarization conversion element is configured to convert the plurality of second polarized light beams that have been reflected by the mirror into the plurality of third polarized light beams, and to emit the plurality of third polarized light beams in the first direction of travel.

6. The wavelength beam combining device of claim 5, wherein:

the at least one diffraction grating comprises:

a first diffraction grating disposed at a position for receiving the plurality of first polarized light beams that have been reflected by the polarization beam splitter in the first direction of travel and the plurality of third polarized light beams emitted from the first polarization conversion element in the first direction of travel, and a second diffraction grating disposed in parallel to the first diffraction grating; and the second diffraction grating includes:

a first region configured to receive reflection-diffracted light generated by the first diffraction grating from the plurality of first polarized light beams and to emit the first wavelength-combined beam in the first direction of travel, and a second region configured to receive reflection-diffracted light generated by the first diffraction grating from the plurality of third polarized light beams and to emit the second wavelength-combined beam in the first direction of travel.

7. The wavelength beam combining device of claim 6, wherein:

each of the first diffraction grating and the second diffraction grating is a transmission-type diffraction grating.

8. The wavelength beam combining device of claim 6, wherein:

the first region and the second region of the second diffraction grating are formed as distinct elements that are isolated from each other by an interspace.

9. The wavelength beam combining device of claim 6, wherein:

diffraction grooves in each of the first region and the second region are parallel to the first polarization direction; and the diffraction grooves in each of the first region and the second region have a grating pitch of 200 nm or more and 500 nm or less, and a quantity of diffraction grooves in each of the first region and the second region is 2000 or more and 5000 or less.

10. The wavelength beam combining device of claim 1, further comprising:

a stop or stops for at least one of the first wavelength-combined beam, the second wavelength-combined beam, and the third wavelength-combined beam.

11. A direct diode laser device comprising:

the wavelength beam combining device of claim 1;

a plurality of semiconductor laser devices configured to emit laser light of respectively different peak wavelengths; and an optical fiber array device configured to generate, from the laser light emitted from the plurality of semiconductor laser devices, the plurality of laser beams to be incident on the polarization beam splitter of the wavelength beam combining device.

12. The direct diode laser device of claim 11, wherein:

each of the plurality of semiconductor laser devices is configured to lase in a single longitudinal mode.

13. The direct diode laser device of claim 11, wherein:

the respectively different peak wavelengths are contained within a range of 430 nm to 480 nm.

14. The direct diode laser device of claim 11, wherein:

the optical fiber array device is configured to emit the plurality of laser beams so as to be parallel to one another.

15. A laser processing machine comprising:

at least one direct diode laser device of claim 11 an optical transmission fiber coupled to the third wavelength-combined beam or third wavelength-combined beams emitted from the at least one direct diode laser device; and a processing head connected to the optical transmission fiber.

\* \* \* \* \*